United States Patent
Lim et al.

(10) Patent No.: US 9,847,418 B1
(45) Date of Patent: Dec. 19, 2017

(54) METHODS OF FORMING FIN CUT REGIONS BY OXIDIZING FIN PORTIONS

(71) Applicant: GLOBALFOUNDRIES Inc., Grand Cayman (KY)

(72) Inventors: Kwan-Yong Lim, Niskayuna, NY (US); Min Gyu Sung, Latham, NY (US); Chanro Park, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/219,917

(22) Filed: Jul. 26, 2016

(51) Int. Cl.
| H01L 21/33 | (2006.01) |
|---|---|
| H01L 21/20 | (2006.01) |
| H01L 21/36 | (2006.01) |
| H01L 29/78 | (2006.01) |
| H01L 29/66 | (2006.01) |

(52) U.S. Cl.
CPC ...... H01L 29/7848 (2013.01); H01L 29/6653 (2013.01); H01L 29/6656 (2013.01); H01L 29/66795 (2013.01)

(58) Field of Classification Search
CPC ......... H01L 29/78; H01L 29/66; H01L 21/00; H01L 21/82
USPC ........ 438/283, 478, 157, 197, 151; 257/401, 257/E21.421, E21.615, E21.301
See application file for complete search history.

(56) References Cited

U.S. PATENT DOCUMENTS

| 6,882,025 | B2* | 4/2005 | Yeo ................... | H01L 21/76229 257/374 |
|---|---|---|---|---|
| 8,487,348 | B2 | 7/2013 | Cea et al. | |
| 2004/0262687 | A1* | 12/2004 | Jung ...................... | H01L 21/84 257/347 |
| 2005/0224875 | A1* | 10/2005 | Anderson ......... | H01L 21/76251 257/347 |
| 2006/0244051 | A1* | 11/2006 | Izumida ............ | H01L 29/66818 257/327 |
| 2009/0032859 | A1* | 2/2009 | Zhu ................... | H01L 21/28273 257/316 |
| 2010/0144121 | A1* | 6/2010 | Chang ................. | H01L 29/7851 438/478 |
| 2010/0163971 | A1* | 7/2010 | Hung ................. | H01L 29/66795 257/327 |
| 2010/0213548 | A1* | 8/2010 | Chang ............. | H01L 21/823878 257/348 |
| 2011/0068375 | A1* | 3/2011 | Jakschik ................ | H01L 21/84 257/255 |
| 2011/0108920 | A1* | 5/2011 | Basker .................. | H01L 21/845 257/351 |
| 2011/0198696 | A1* | 8/2011 | Choi ................. | H01L 21/76229 257/347 |
| 2012/0007180 | A1* | 1/2012 | Yin ................... | H01L 29/66795 257/347 |

(Continued)

*Primary Examiner* — Sheikh Maruf
(74) *Attorney, Agent, or Firm* — Amerson Law Firm, PLLC

(57) ABSTRACT

A method includes forming a fin on a substrate. A first liner is formed on the fin. A first dielectric layer is formed above the first liner. A patterned hard mask is formed above the first dielectric layer and has a fin cut opening defined therein. Portions of the first dielectric layer and the first liner disposed below the fin cut opening are removed to expose a portion of the fin. The patterned hard mask layer is removed. The exposed portion of the fin is oxidized to define a diffusion break in the fin.

20 Claims, 19 Drawing Sheets

(56) References Cited

U.S. PATENT DOCUMENTS

| | | | |
|---|---|---|---|
| 2012/0292672 A1* | 11/2012 | Cho | H01L 21/823431 257/288 |
| 2013/0049080 A1* | 2/2013 | Okano | H01L 29/66795 257/288 |
| 2013/0187237 A1* | 7/2013 | Yu | H01L 21/823807 257/369 |
| 2013/0193526 A1* | 8/2013 | Lo | H01L 27/0255 257/401 |
| 2013/0224945 A1* | 8/2013 | Liu | H01L 29/66795 438/595 |
| 2014/0061820 A1* | 3/2014 | Reznicek | H01L 21/823821 257/401 |
| 2014/0110755 A1* | 4/2014 | Colinge | H01L 29/41791 257/192 |
| 2014/0239393 A1* | 8/2014 | Kuo | H01L 29/785 257/347 |
| 2015/0206890 A1* | 7/2015 | Liaw | H01L 27/1104 257/391 |
| 2015/0303284 A1* | 10/2015 | Basker | H01L 29/66803 257/288 |
| 2015/0311341 A1* | 10/2015 | Hur | H01L 21/02532 257/190 |
| 2016/0155739 A1* | 6/2016 | Ting | H01L 29/0653 257/401 |
| 2017/0012100 A1* | 1/2017 | Leobandung | H01L 29/1083 |

* cited by examiner

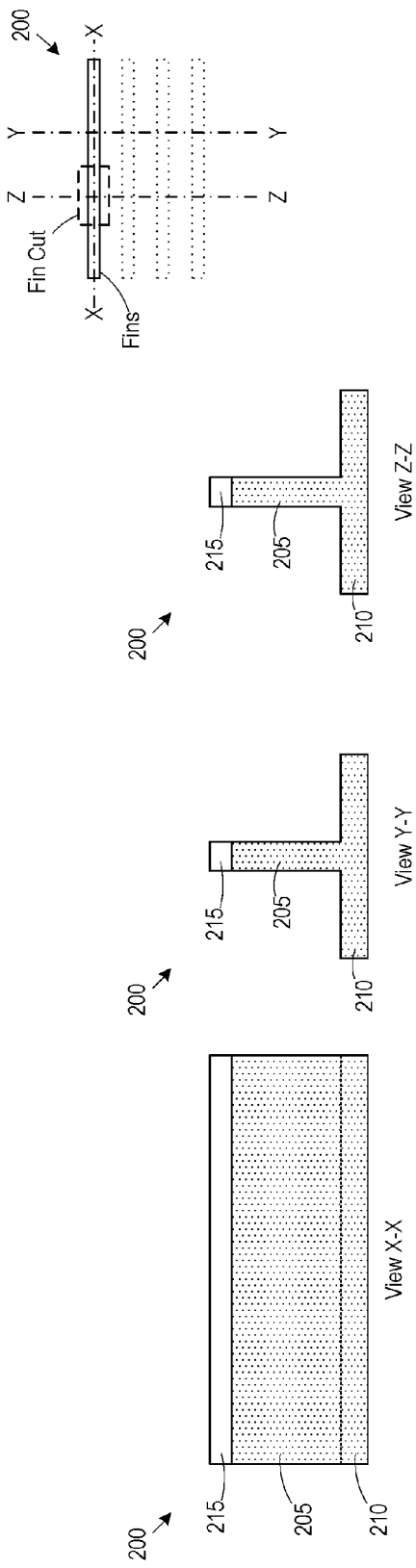
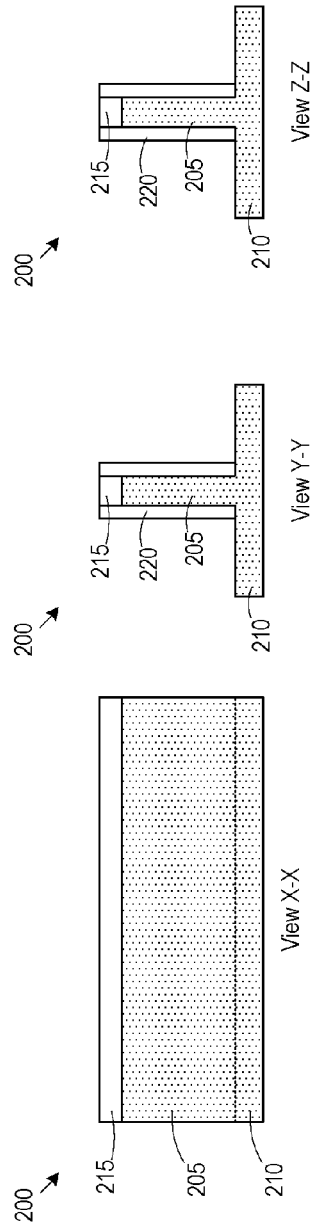
Figure 2A
Figure 2B

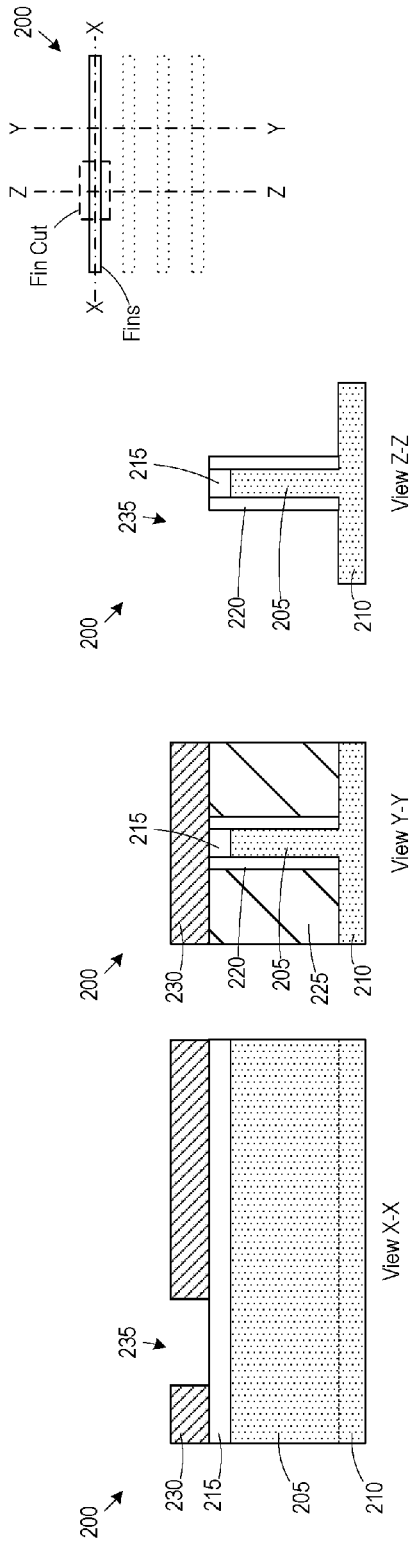
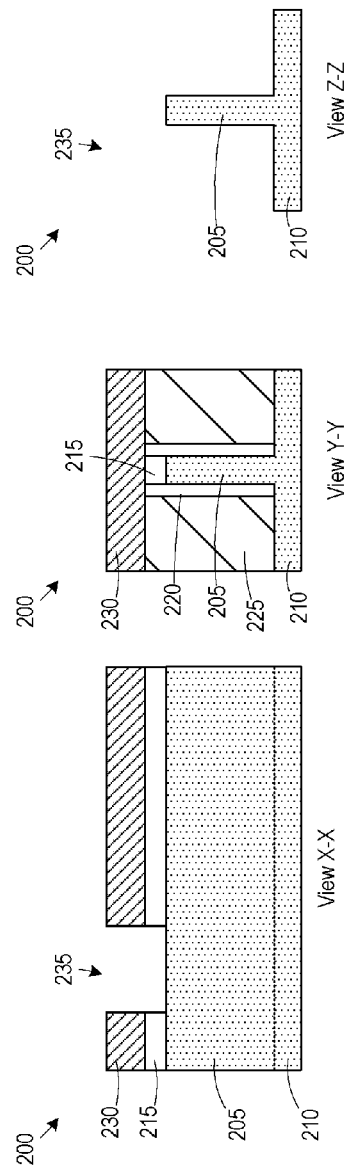
Figure 2E
Figure 2F

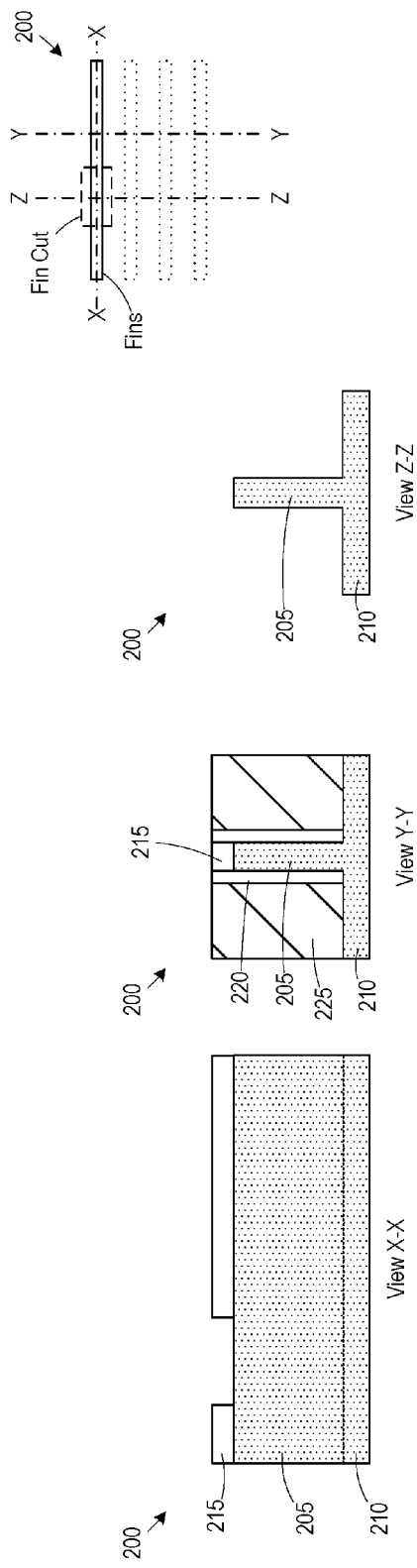
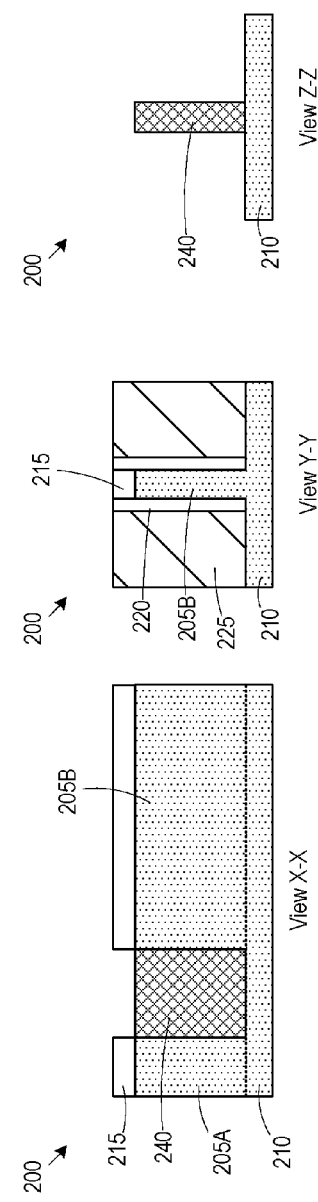
Figure 2G
Figure 2H

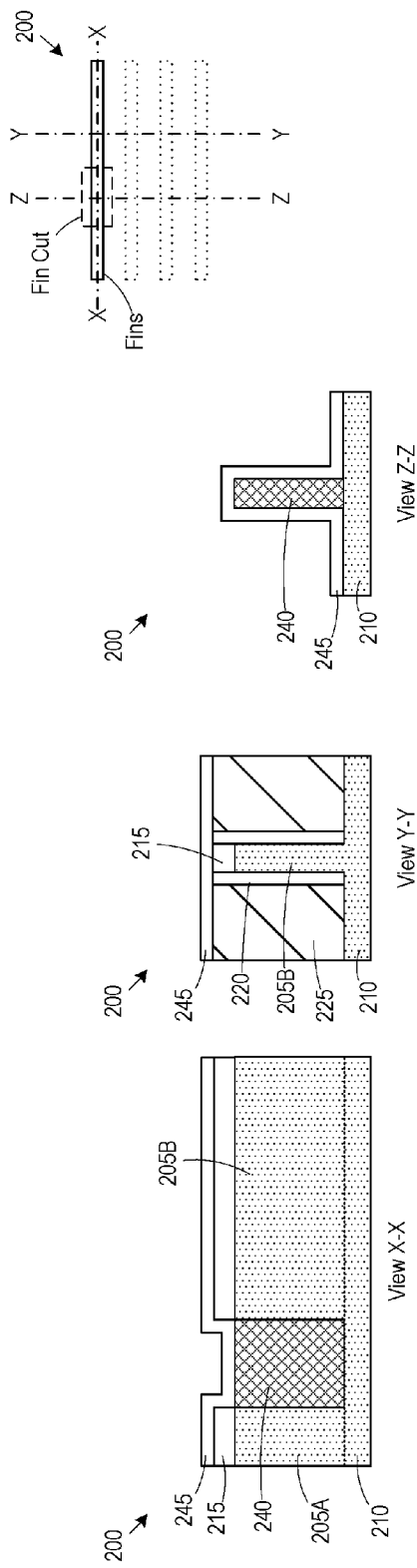
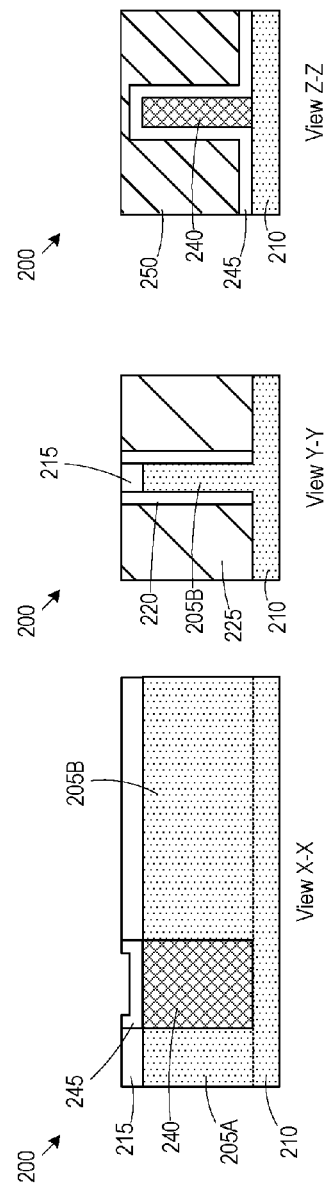
Figure 2I
Figure 2J

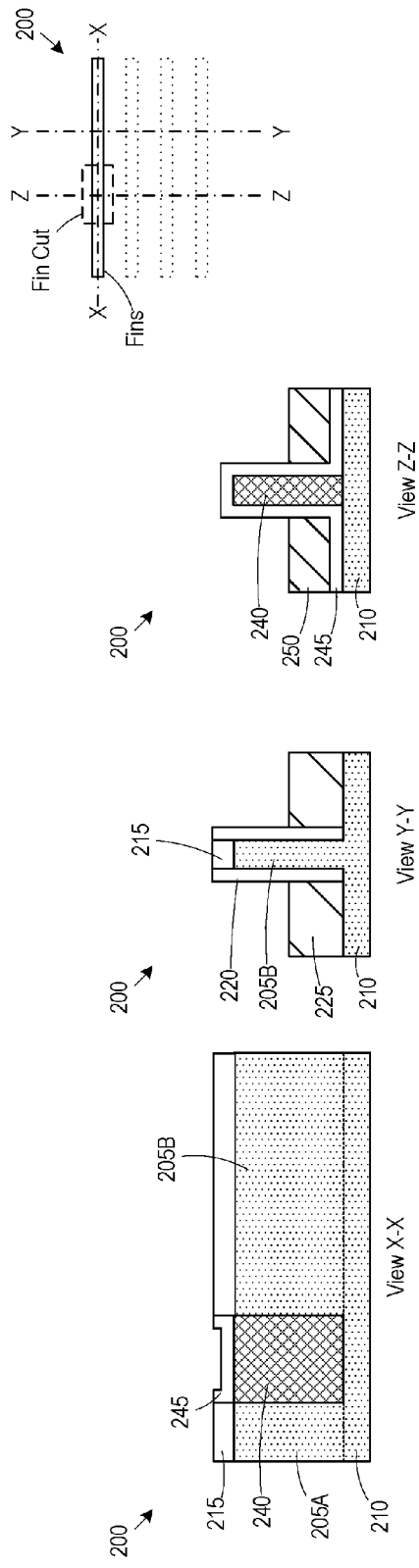
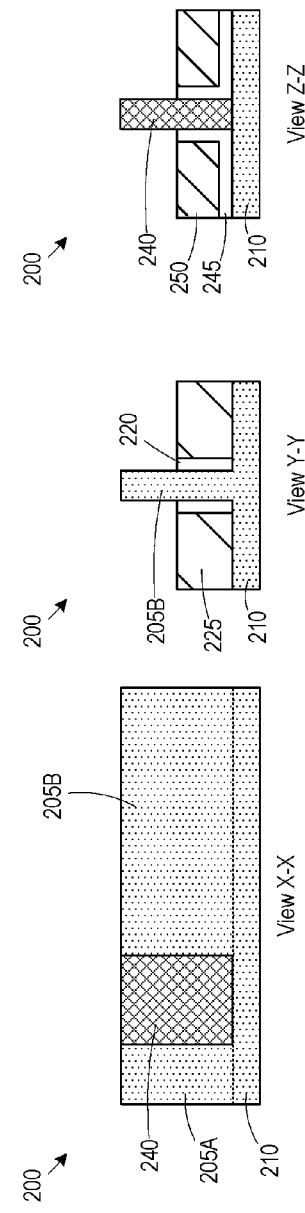
Figure 2K
Figure 2L

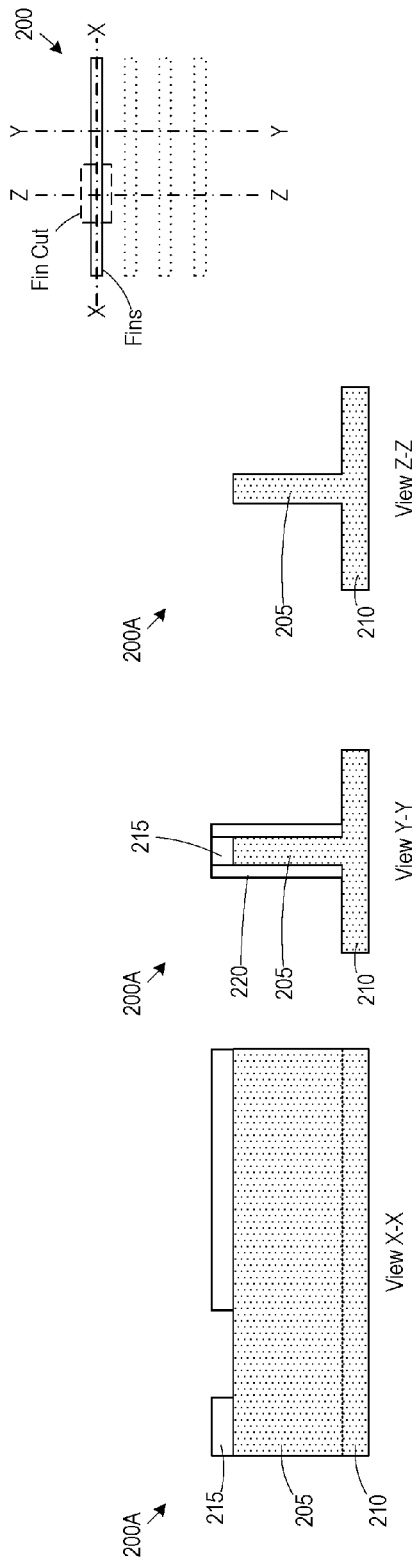
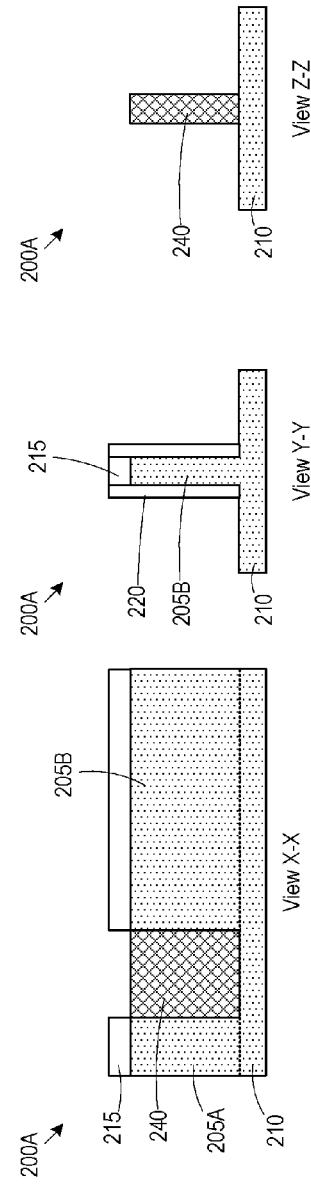
Figure 3A
Figure 3B

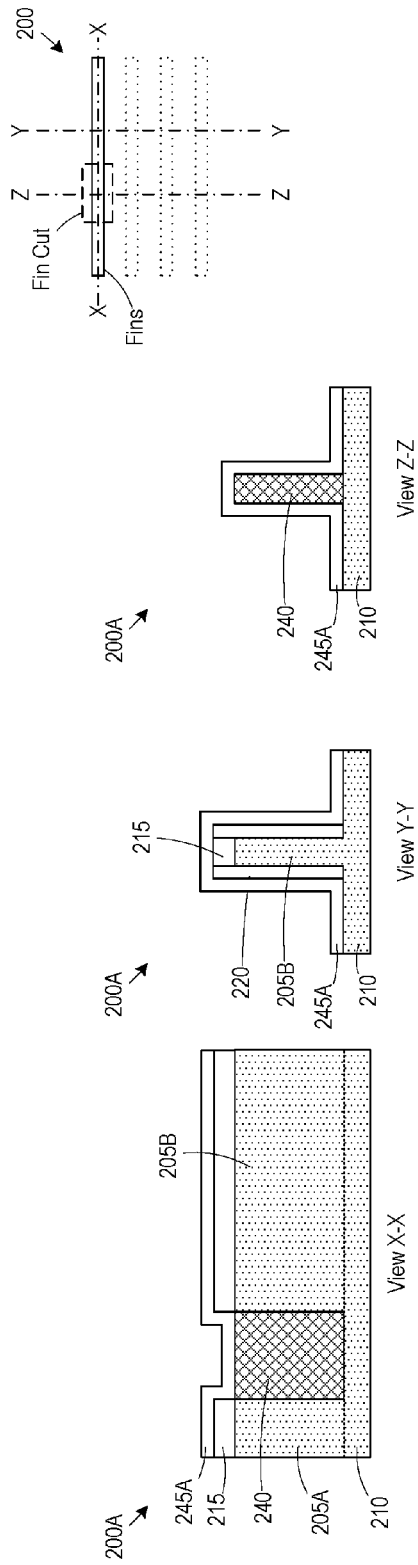
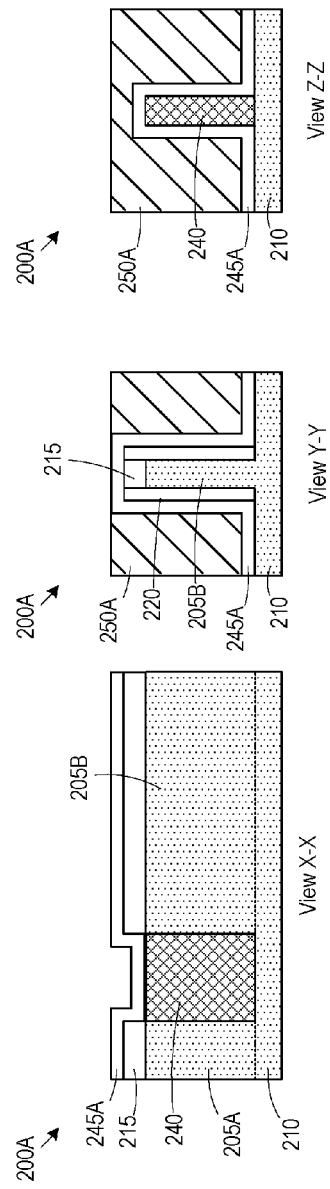
Figure 3C
Figure 3D

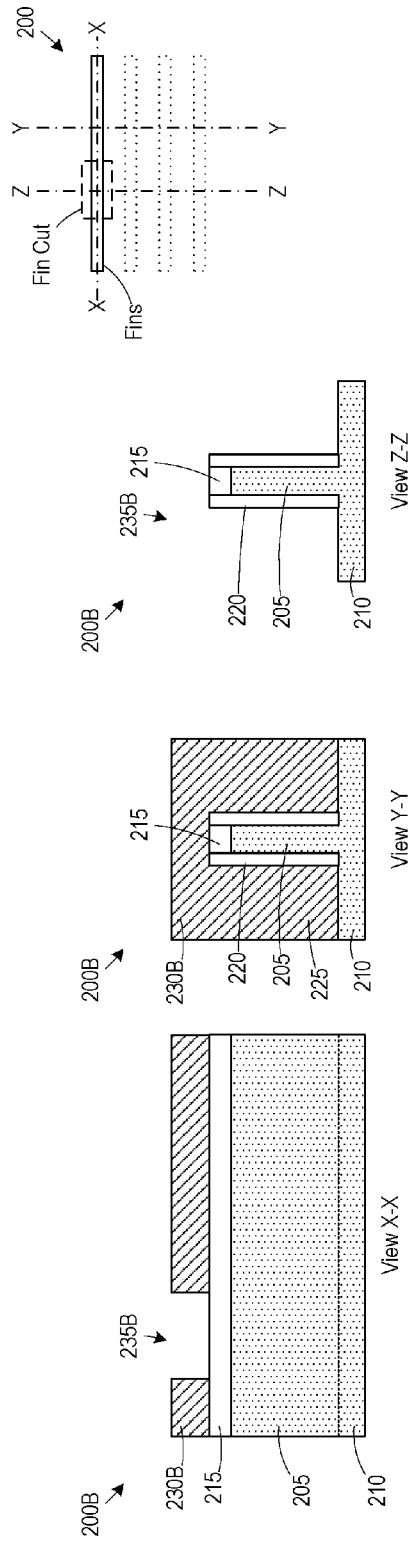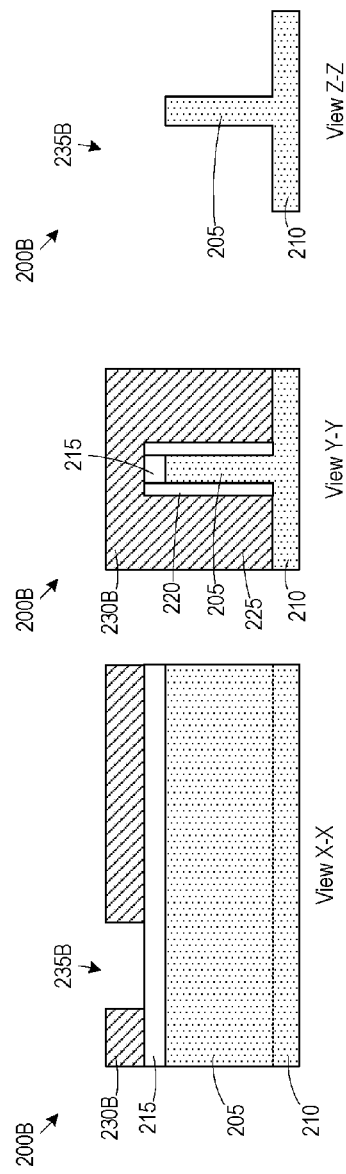
Figure 4A
Figure 4B

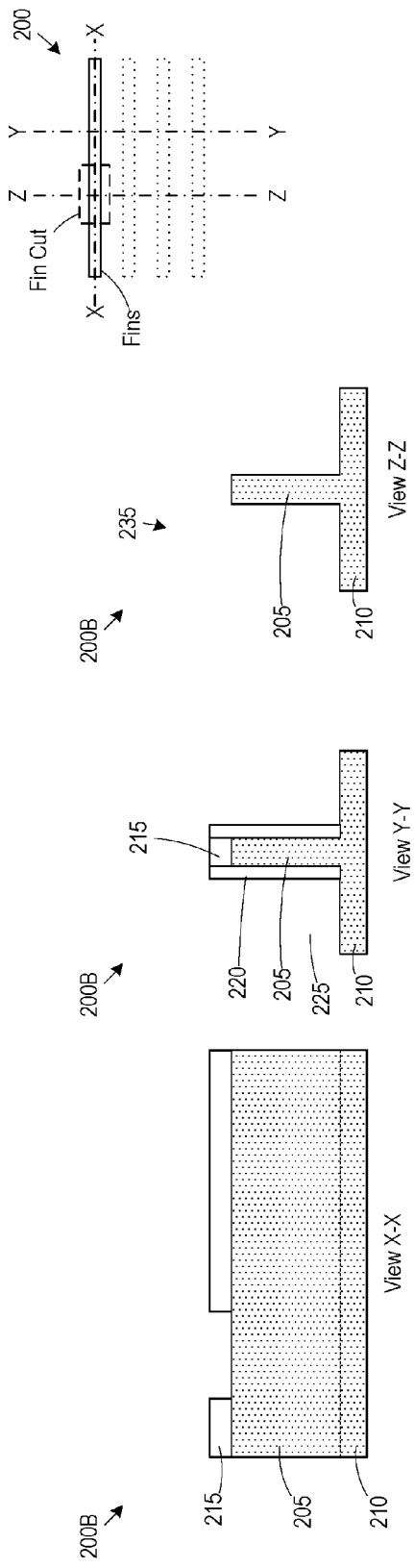
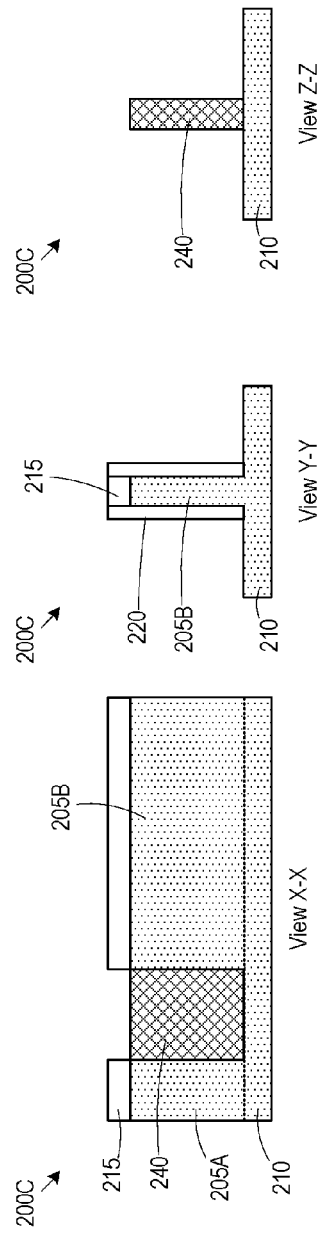
Figure 4C
Figure 5A

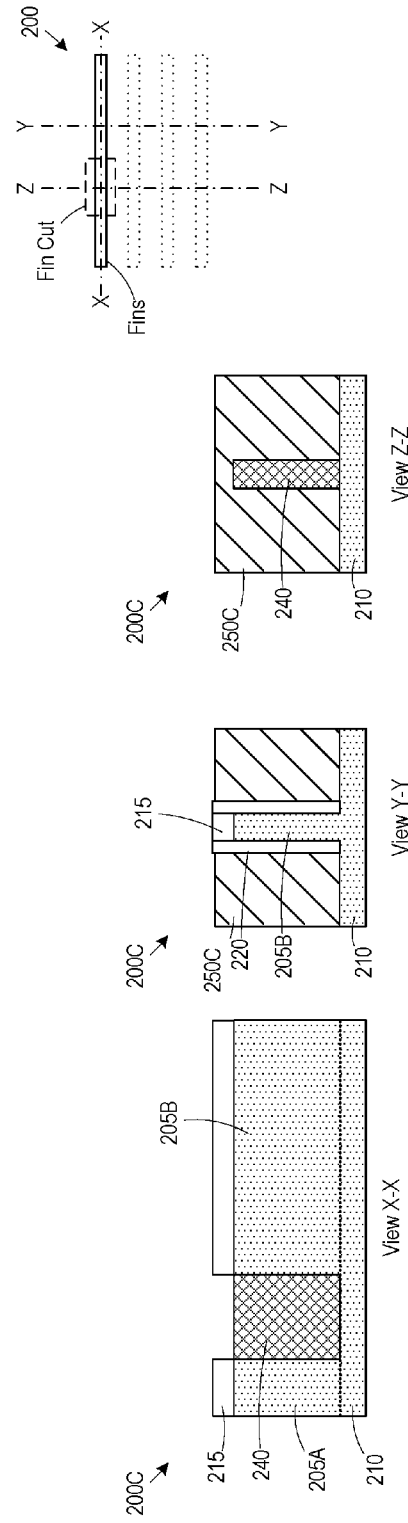
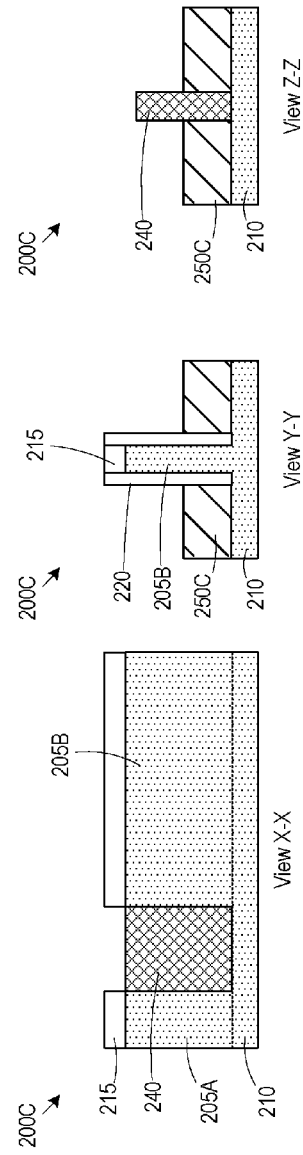
Figure 5B
Figure 5C

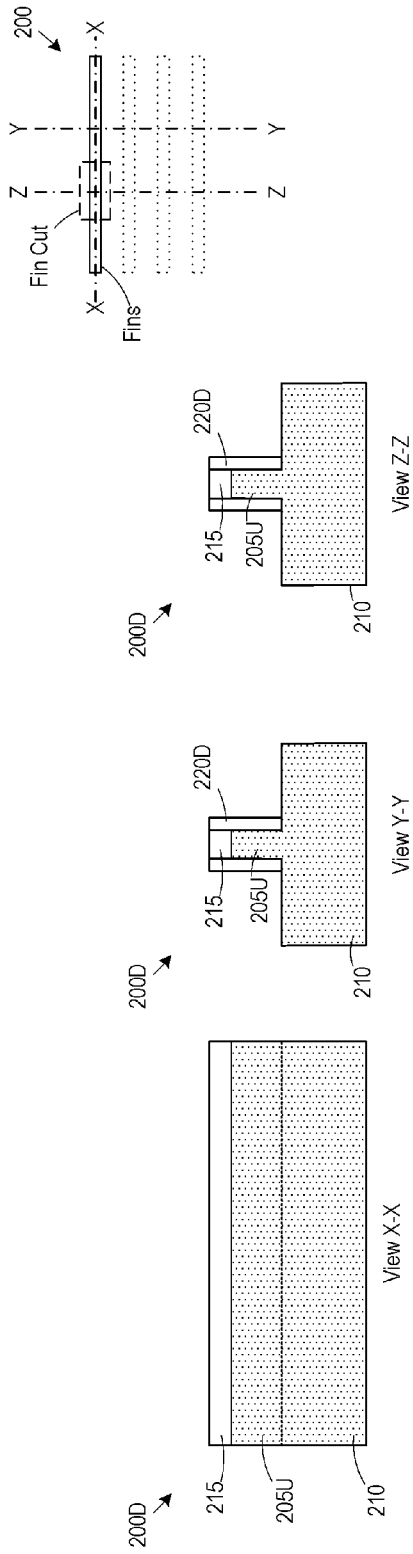
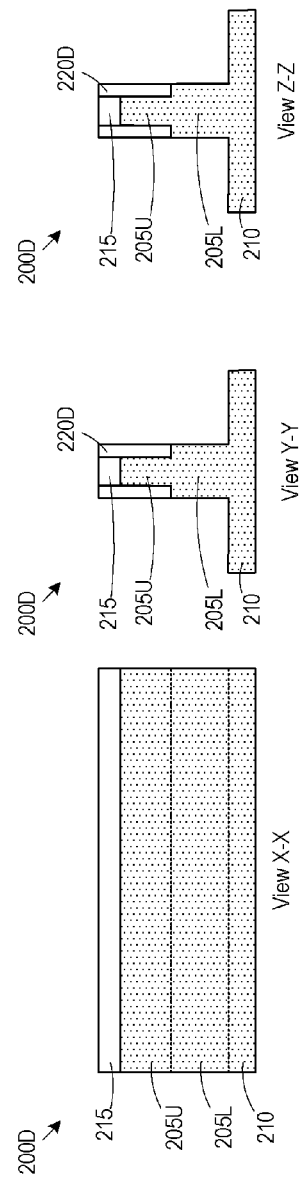
Figure 6B
Figure 6C

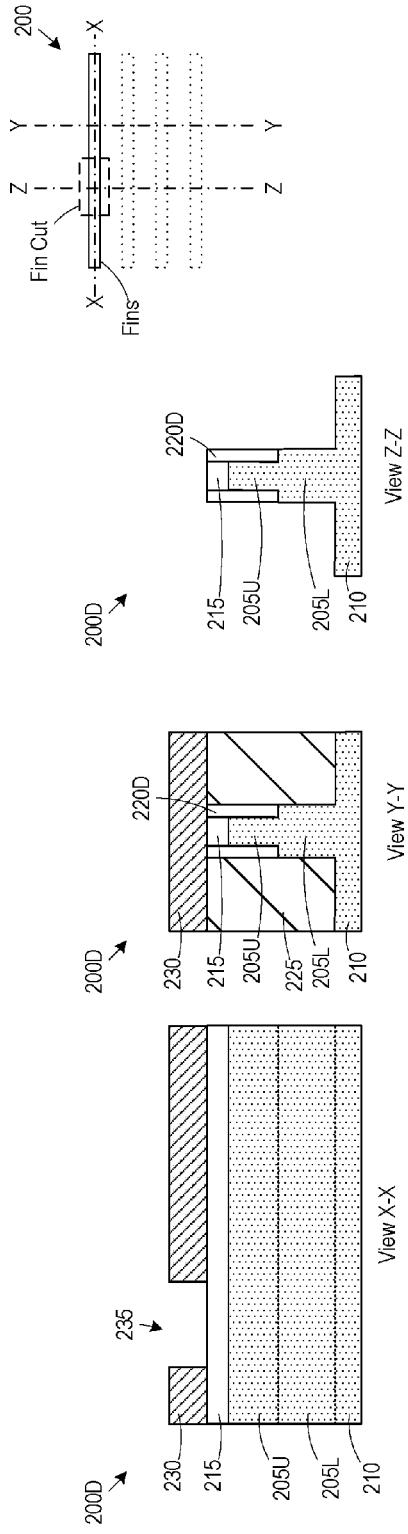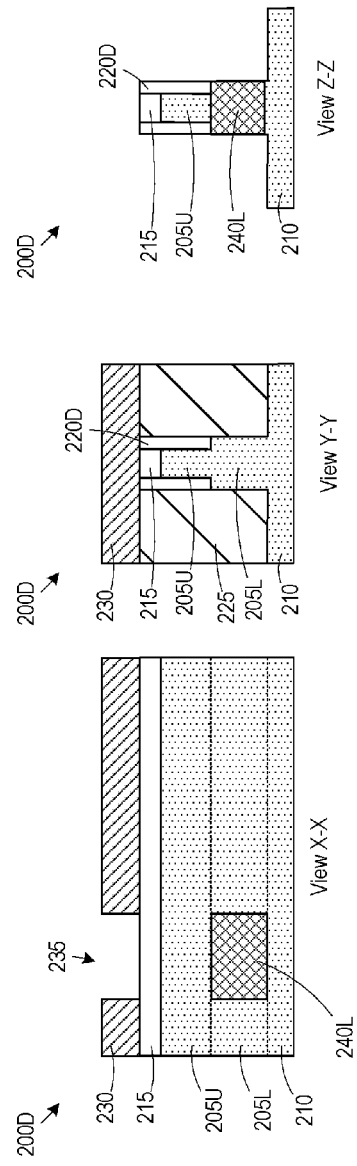
Figure 6F
Figure 6G

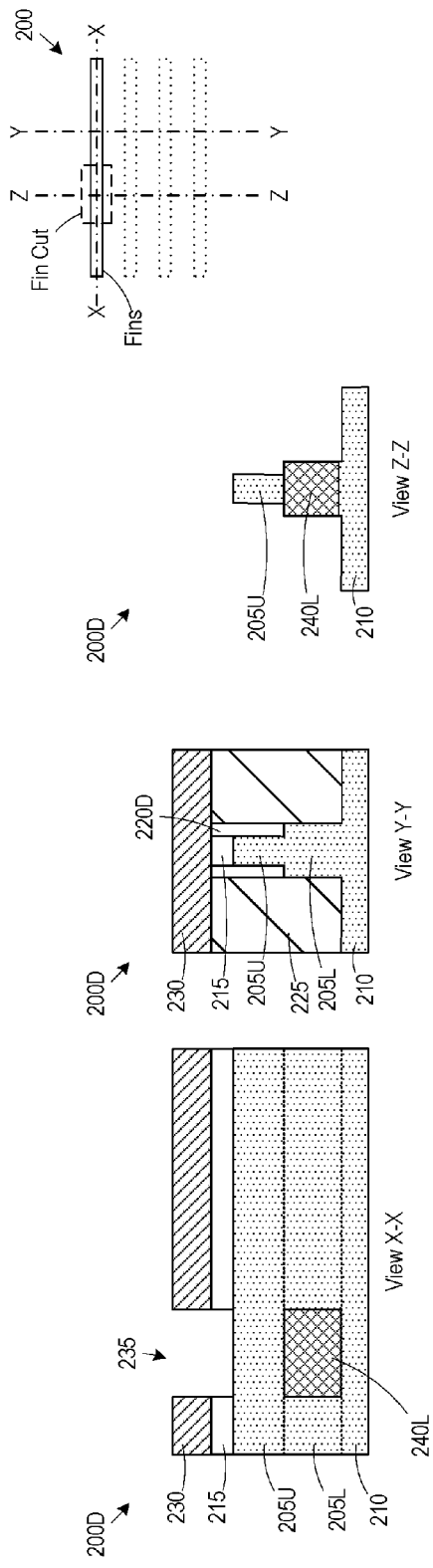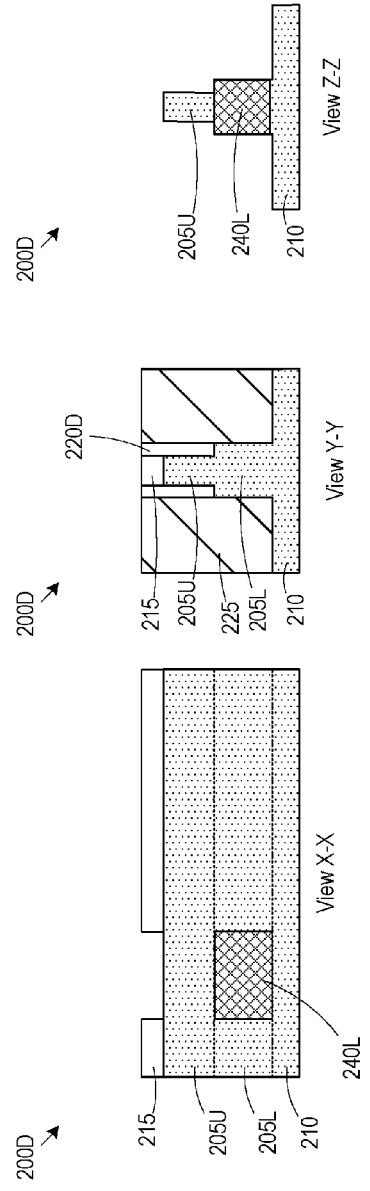
Figure 6H
Figure 6I

METHODS OF FORMING FIN CUT REGIONS BY OXIDIZING FIN PORTIONS

BACKGROUND OF THE INVENTION

1. Field of the Invention

The present disclosure generally relates to the fabrication of integrated circuits, and, more particularly, to various methods of performing fin cut etch processes for taper FinFET semiconductor devices and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In some applications, fins for FinFET devices are formed such that the fin is vertically spaced apart from and above the substrate with an isolation material positioned between the fin and the substrate. FIG. 1 is a perspective view of an illustrative prior art FinFET semiconductor device 100 that is formed above a semiconductor substrate 105 at an intermediate point during fabrication. In this example, the FinFET device 100 includes three illustrative fins 110, an isolation material 130, a gate structure 115, sidewall spacers 120 and a gate cap layer 125. The fins 110 have a three-dimensional configuration: a height, a width and an axial length. The portions of the fins 110 covered by the gate structure 115 are the channel regions of the FinFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

A particular fin 110 may be used to fabricate multiple devices. To segment a fin 110 into multiple portions, a diffusion break may be formed in the fin. Typically a fin cut (FC) process is employed to etch a portion of the fin and fill the resulting cavity with a dielectric material to define the diffusion break. Subsequently, an array of gate electrodes is formed above the fins. Typically, a non-functional or dummy gate electrode is formed above the diffusion break to provide pitch and dimension regularity in the overall array of gate electrodes. The initial gate electrodes may be replacement electrodes, where a sacrificial material is first formed and then replaced at a different point in the process flow with a metal gate electrode. Misalignment between the dummy gate electrode and the diffusion break can cause problems with the etching of the sacrificial material to form the replacement gate electrodes, resulting in a larger base region of the gate electrode that is not entirely covered by sidewall spacer material. When the replacement process is implemented, this exposed portion of the sacrificial material becomes an exposed metal portion, giving rise to potential gate to source/drain shorts. Another problem with an etch-based fin cut process is that the etching of the selected portion of the fin tends to relax a stressed material of the upper fin portions where devices are formed. This stress relaxation may potentially degrade performance of the devices.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming diffusion breaks in fins for FinFET semiconductor devices, and the resulting semiconductor devices. One method includes, among other things, forming a fin on a substrate. A first liner is formed on the fin. A first dielectric layer is formed above the first liner layer. A patterned hard mask is formed above the first dielectric layer and has a fin cut opening defined therein. Portions of the first dielectric layer and the first liner disposed below the fin cut opening are removed to expose a portion of the fin. The patterned hard mask layer is removed. The exposed portion of the fin is oxidized to define a diffusion break in the fin.

Another illustrative method disclosed herein includes, among other things, forming a fin on a substrate. A cap layer is disposed on a top surface of the fin. A first spacer is formed on the fin. A first dielectric layer is formed above the fin. A patterned hard mask is formed above the first dielectric layer and has a fin cut opening defined therein. Portions of the first dielectric layer, the cap layer and the first spacer disposed below the fin cut opening are removed to expose a portion of the fin. The patterned hard mask layer is removed. The exposed portion of the fin is oxidized to define a diffusion break in the fin. A liner is formed on the diffusion break. A second dielectric layer is formed above the diffusion break. An upper portion of the fin covered by the cap layer and the first spacer and an upper portion of the diffusion break covered by the liner are exposed. The cap layer and a portion of the first spacer disposed on the upper portion of the fin are removed. A portion of the liner disposed on the upper portion of the diffusion break is removed.

BRIEF DESCRIPTION OF THE DRAWINGS

The disclosure may be understood by reference to the following description taken in conjunction with the accompanying drawings, in which like reference numerals identify like elements, and in which:

FIGS. 2A-2L depict one illustrative method disclosed for forming diffusion breaks in fins for a semiconductor product and the resulting semiconductor devices; and FIGS. 3A-3F depict an alternative process flow for forming diffusion breaks in fins for a semiconductor product and the resulting semiconductor devices;

FIGS. 4A-4C depict another alternative process flow for forming diffusion breaks in fins for a semiconductor product and the resulting semiconductor devices;

FIGS. 5A-5D depict another alternative process flow for forming diffusion breaks in fins for a semiconductor product and the resulting semiconductor devices; and FIGS. 6A-6J depict another alternative process flow for forming diffusion breaks in fins for a semiconductor product and the resulting semiconductor devices.

Figure 1:
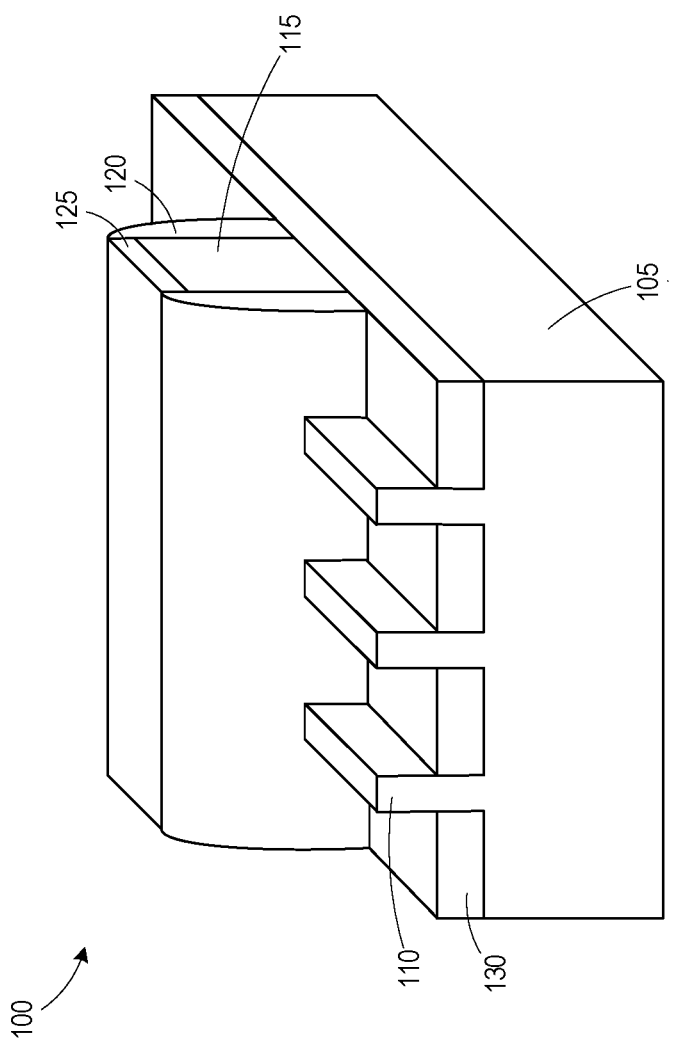
FIG. 1 is a plan view of one illustrative embodiment of a prior art semiconductor product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming diffusion breaks in fins for FinFET semiconductor devices and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs.

The inventions disclosed herein should not be considered to be limited to the illustrative examples depicted and described herein. With reference to the attached figures, various illustrative embodiments of the methods and devices disclosed herein will now be described in more detail.

FIGS. 2A-2L depict one illustrative method disclosed for forming diffusion breaks in fins for semiconductor products and the resulting devices. The illustrative product 200 includes a fin 205 formed in a semiconductor substrate 210. A cap layer 215 is formed above the fin 205. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers. The fin 205 may be formed of the same material as the substrate 210 by etching trenches in the substrate 210 using the cap layer 215 as an etch mask. In some embodiments, the fin 205 may include a lower portion (e.g., the same material as the substrate 210) and an upper portion made from a different material (e.g., strained silicon germanium). The upper portion may be formed by forming a layer of the different material above the substrate 210 prior to etching the fin 205, or by forming the fin 205, removing a portion of the fin 205 and epitaxially growing the upper portion of the fin 205.

FIGS. 2A-2L also include a simplistic plan view of the product 200 (in the upper right corner of each sheet) that depicts the location where various cross-sectional views depicted in the following drawings will be taken. More specifically, the view "X-X" is taken along the long axis of the fin 205, the view "Y-Y" is a cross-sectional view that is taken through the fin 205 in a direction that is transverse to the long axis of the fin 205 in a fin cut (FC) region, and the view "Z-Z" is a cross-sectional view that is taken through the fin 205 in a direction that is transverse to the long axis of the fin 205 outside the FC region. Not all of the features illustrated in the views "X-X", "Y-Y" and "Z-Z" are replicated in the simplistic plan view. In an actual implementation, a plurality of fins 205 is typically present (as indicated by the dashed fins in the plan view), but for ease of illustration, only a single fin 205 is illustrated in the views.

FIG. 2B illustrates the product 200 after a first liner 220 (e.g., sidewall spacers) was formed on the fin 205. The first liner 220 was formed by depositing a liner material (e.g., silicon nitride) above the fin 205 and performing an anisotropic etch process to remove portions disposed above the cap layer 215 and the surface of the substrate 210.

Figure 2C:
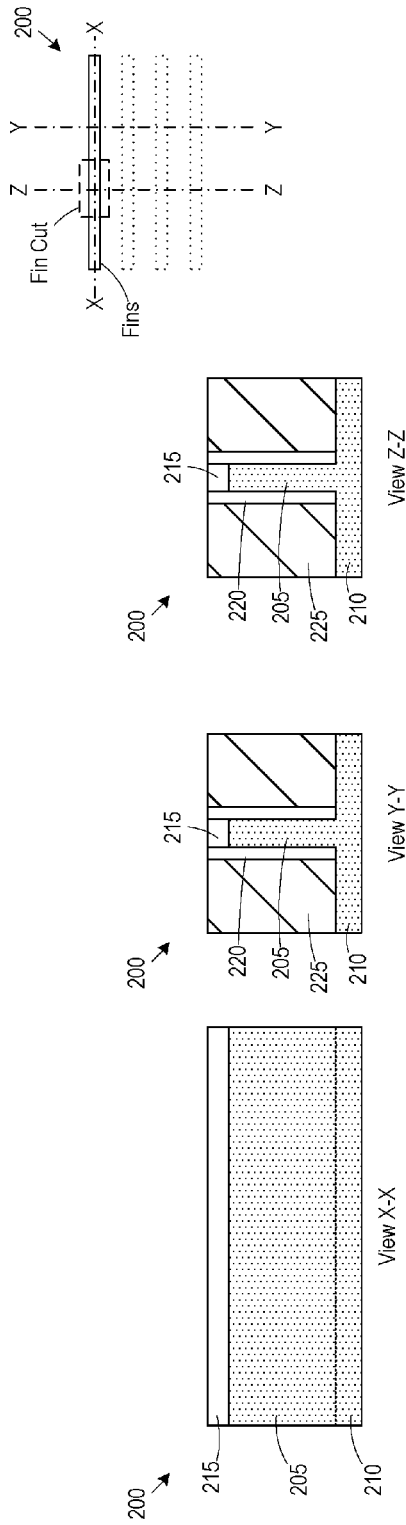

FIG. 2C illustrates the product after a deposition process was performed to form a dielectric layer 225 (e.g., silicon dioxide, a low-k material, or an ultralow-k material) above the fin 205 and a planarization process was performed to expose the cap layer 215.

Figure 2D:
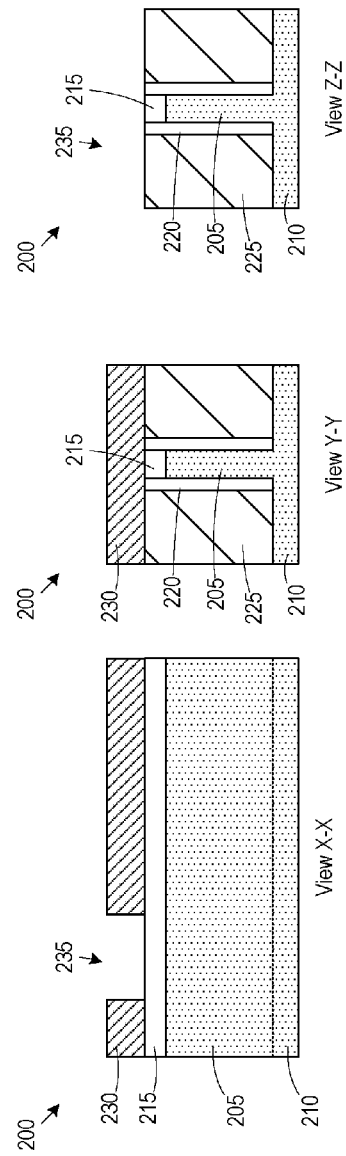

FIG. 2D illustrates the product 200 after a patterned mask layer 230 (e.g., spin-on hard mask (SOH) or amorphous carbon) was formed above the dielectric layer 225. The patterned mask layer 230 may be formed by depositing a layer of mask material, forming a patterning stack including a plurality of layers, such as a spin-on hard mask (SOH) layer, an oxide layer, a bottom anti-reflective coating (BARC) layer, a photoresist layer, etc., patterning the stack to define an opening above the mask layer 230, and etching the mask layer 230 to define an opening 235 therein. In general, the opening 235 is a fin cut opening 235.

FIG. 2E illustrates the product 200 after an etch process was performed to recess the dielectric layer 225 disposed below the fin cut opening 235.

FIG. 2F illustrates the product 200 after an etch process (e.g., wet strip process) was performed to remove the exposed portions of the cap layer 215 and the first liner 220, thereby exposing a portion of the fin 205 below the fin cut opening 235.

FIG. 2G illustrates the product 200 after an etch process was performed to remove the mask layer 230.

FIG. 2H illustrates the product 200 after an oxidation process (e.g., wet or dry oxidation 700° C.-1000° C.) was performed to oxidize the exposed portion of the fin 205 to define a diffusion break 240 (e.g., oxidized fin portion) in the fin 205, dividing the fin 205 into separate segments 205A, 205B.

FIG. 2I illustrates the product 200 after a second liner 245 (e.g., silicon nitride) was formed on the dielectric layer 225 and the diffusion break 240.

FIG. 2J illustrates the product after a deposition process was performed to form a second dielectric layer 250 (e.g., silicon dioxide, a low-k material, or an ultralow-k material) above the diffusion break 240 and a planarization process was performed to expose the cap layer 215. Portions of the second liner 245 disposed above the dielectric layer 225 may be removed during the planarization process or by a timed etch after the planarization.

FIG. 2K illustrates the product 200 after an etch process was performed to recess the dielectric layers 225, 250.

FIG. 2L illustrates the product after an etch process (e.g., wet strip) was performed to remove the portions of the liners 220, 245 and the cap layer 215 exposed by recessing the dielectric layers 225, 250, thereby exposing upper portions of the fin segments 205A, 205B separated by the diffusion break 240.

Additional processing may be performed to complete fabrication of the product 200, such as forming gate structures, source/drain regions, metallization layers, etc. Forming the diffusion break 240 by oxidizing a portion of the fin 205 instead of removing the fin portion and replacing it with oxide results in an increased height to the diffusion break 240, thereby reducing the likelihood of problems arising from misalignment with the gate structure. In addition, the thermal oxidation process preserves strain present in the material of the fin 205.

Figure 3E:
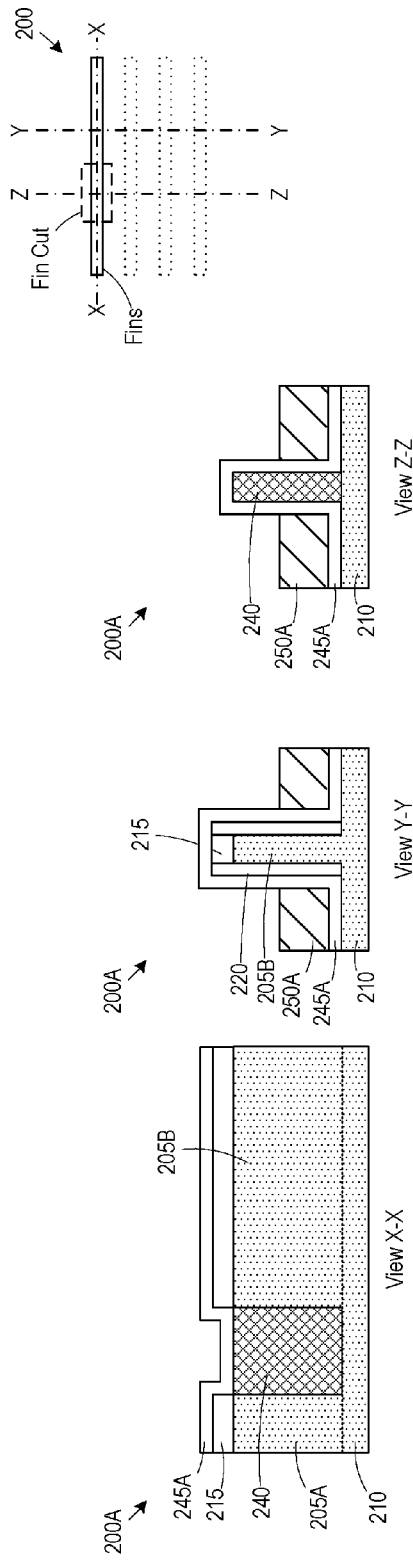

FIGS. 3A-3F illustrate an alternative process flow for forming diffusion breaks in a product 200A. FIG. 3A illustrates the product 200 of FIG. 2G after an etch process was performed to remove the dielectric layer 225.

FIG. 3B illustrates the product 200A after an oxidation process (e.g., thermal oxidation) was performed to oxidize the exposed portion of the fin 205 to define a diffusion break 240 (e.g., oxidized fin portion) in the fin 205, dividing the fin 205 into separate segments 205A, 205B.

FIG. 3C illustrates the product 200A after a second liner 245A (e.g., sidewall spacer) was formed above the first liner 220 and the diffusion break 240. The second liner 245A was formed by depositing a liner material (e.g., silicon nitride) above the diffusion break 240 and the fin 205 and performing an anisotropic etch process to remove horizontal portions of the liner material.

FIG. 3D illustrates the product 200A after a deposition process was performed to form a second dielectric layer 250A (e.g., silicon dioxide, a low-k material, or an ultralow-k material) above the fin 205 and a planarization process was performed to expose the second liner 245A.

FIG. 3E illustrates the product 200A after an etch process was performed to recess the dielectric layer 250A.

Figure 3F:
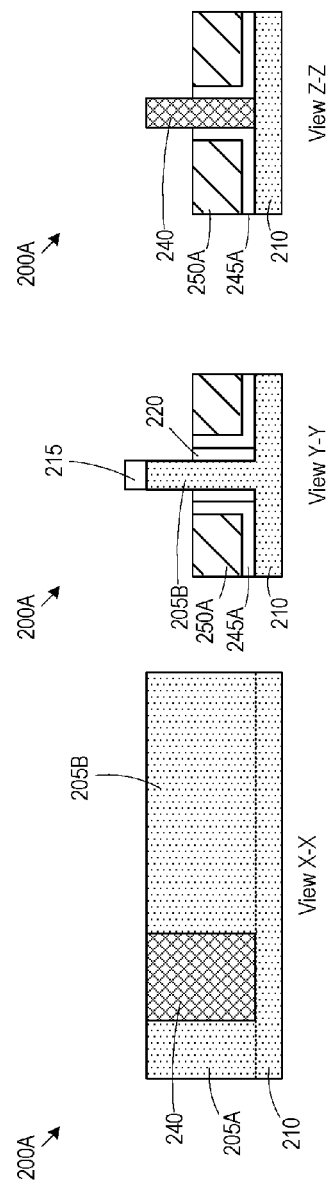

FIG. 3F illustrates the product after an etch process (e.g., wet strip) was performed to remove the portions of the liners 220, 245A and the cap layer 215 exposed by recessing the dielectric layer 250A, thereby exposing upper portions of the fin segments 205A, 205B separated by the diffusion break 240.

FIGS. 4A-4C illustrate an alternative process flow for forming diffusion breaks in a product 200B. FIG. 4A illustrates the product 200 of FIG. 2B after a deposition process was performed to form a patterned mask layer 230B (e.g., spin-on hard mask (SOH) or amorphous carbon) around the fin 205. The patterned mask layer 230B may be formed by depositing a layer of mask material, forming a patterning stack including a plurality of layers, such as a spin-on hard mask (SOH) layer, an oxide layer, a bottom anti-reflective coating (BARC) layer, a photoresist layer, etc., patterning the stack to define an opening above the mask layer 230B, and etching the mask layer 230B to define a fin cut opening 235B therein, wherein the fin cut opening 235B extends along the sidewalls of the fin 205.

FIG. 4B illustrates the product 200B after an etch process (e.g., wet strip process) was performed to remove the exposed portions of the cap layer 215 and the first liner 220, thereby exposing a portion of the fin 205 below the fin cut opening 235B.

FIG. 4C illustrates the product 200 after an etch process was performed to remove the mask layer 230B. After removing the mask layer 230B, the product 200B corresponds to the product 200A illustrated in FIG. 3A. The additional process operations illustrated in FIGS. 3B-3F may be performed to complete processing of the fin 205.

Figure 5D:
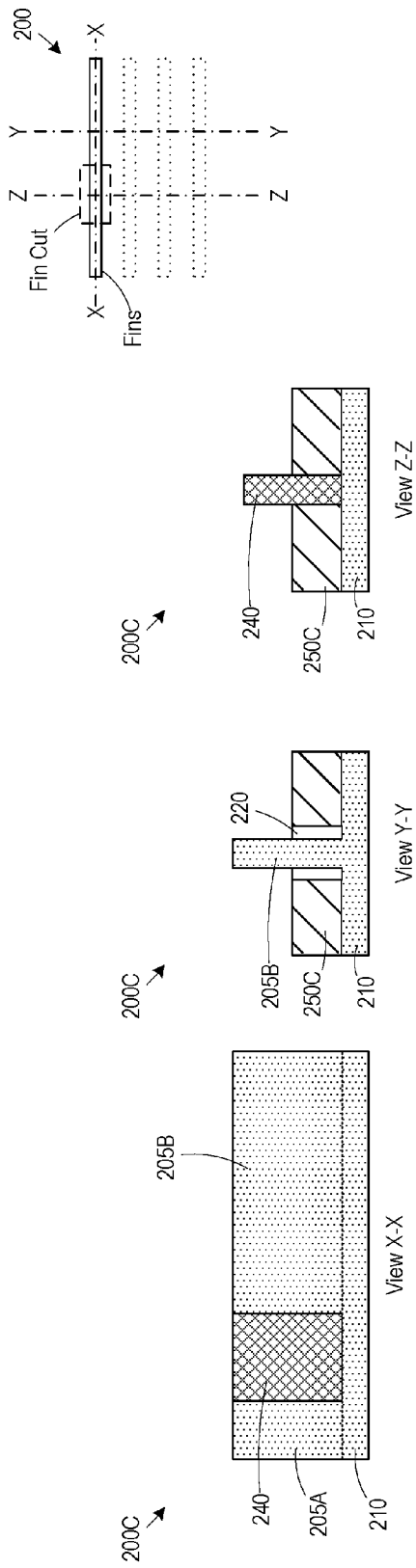

FIGS. 5A-5D illustrate an alternative process flow for forming diffusion breaks in a product 200C. FIG. 5A illustrates the product 200A of FIG. 3B or the product 200B of FIG. 4C (following the oxidation process of FIG. 3B). FIG. 5B illustrates the product 200C after a deposition process was performed to form a second dielectric layer 250C (e.g., silicon dioxide, a low-k material, or an ultralow-k material) above the fin 205 and a planarization process was performed to expose the cap layer 215. In FIG. 5B, the second liner 245, 245A is omitted.

FIG. 5C illustrates the product 200C after an etch process was performed to recess the dielectric layer 250C. In some embodiments, the recess etch process also removes some of the material of the diffusion break 240 because the dielectric layer 250C and the diffusion break are both oxides. However, the etch rate of the diffusion break 240 (thermal oxide) is about two times slower than that of the dielectric layer 250C.

FIG. 5D illustrates the product 200C after an etch process (e.g., wet strip) was performed to remove the portions of the liner 220 and the cap layer 215 exposed by recessing the dielectric layer 250C, thereby exposing upper portions of the fin segments 205A, 205B separated by the diffusion break 240.

FIGS. 6A-6J illustrate an alternative process flow for forming diffusion breaks in a product 200D. The product 200D includes an upper fin portion 205U formed in the substrate 210. A cap layer 215 is formed above the upper fin portion 205U.

FIG. 6B illustrates the product 200D after a first liner 220D (e.g., sidewall spacers) was formed on the upper fin portion 205U. The first liner 220D was formed by depositing a liner material (e.g., silicon nitride) above the upper fin portion 205U and performing an anisotropic etch process to remove portions disposed above the cap layer 215 and the surface of the substrate 210.

FIG. 6C illustrates the product 200D after an anisotropic etch process was performed to etch the substrate 210 to extend the fin trenches to define a lower fin portion 205L.

Figure 6A:
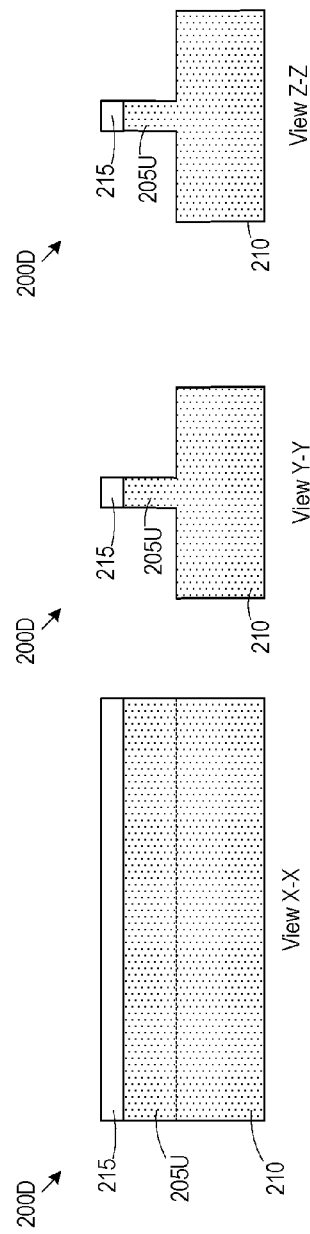
Figure 6D:
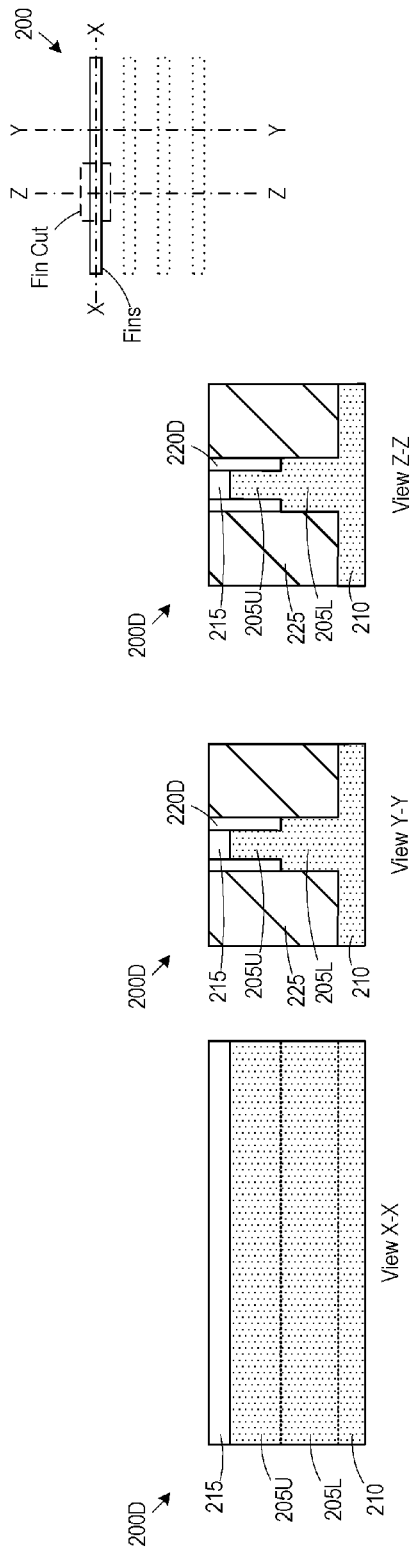

FIG. 6D illustrates the product 200D after a deposition process was performed to form a dielectric layer 225 (e.g., silicon dioxide, a low-k material, or an ultralow-k material) above the fin 205U, 205L and a planarization process was performed to expose the cap layer 215.

Figure 6E:
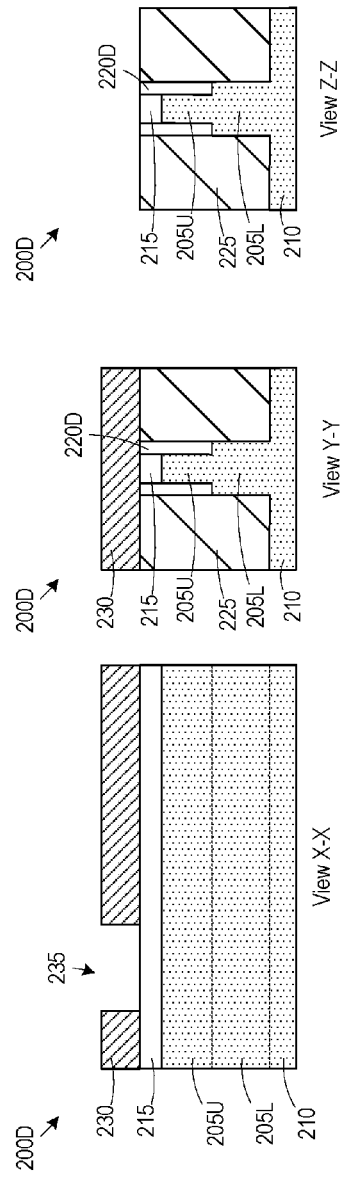

FIG. 6E illustrates the product 200D after a patterned mask layer 230 was formed above the dielectric layer 225. The patterned mask layer 230 includes a fin cut opening 235.

FIG. 6F illustrates the product 200D after an etch process was performed to recess the dielectric layer 225 disposed below the fin cut opening 235.

FIG. 6G illustrates the product 200D after a first oxidation process (e.g., thermal oxidation) was performed to oxidize the exposed portion of the lower fin portion 205L to define a diffusion break portion 240L (e.g., oxidized fin portion).

FIG. 6H illustrates the product 200D after an etch process (e.g., wet strip process) was performed to remove the exposed portions of the cap layer 215 and the first liner 220D, thereby exposing the upper fin portion 205U disposed below the fin cut opening 235.

FIG. 6I illustrates the product 200D after an etch process was performed to remove the mask layer 230.

Figure 6J:
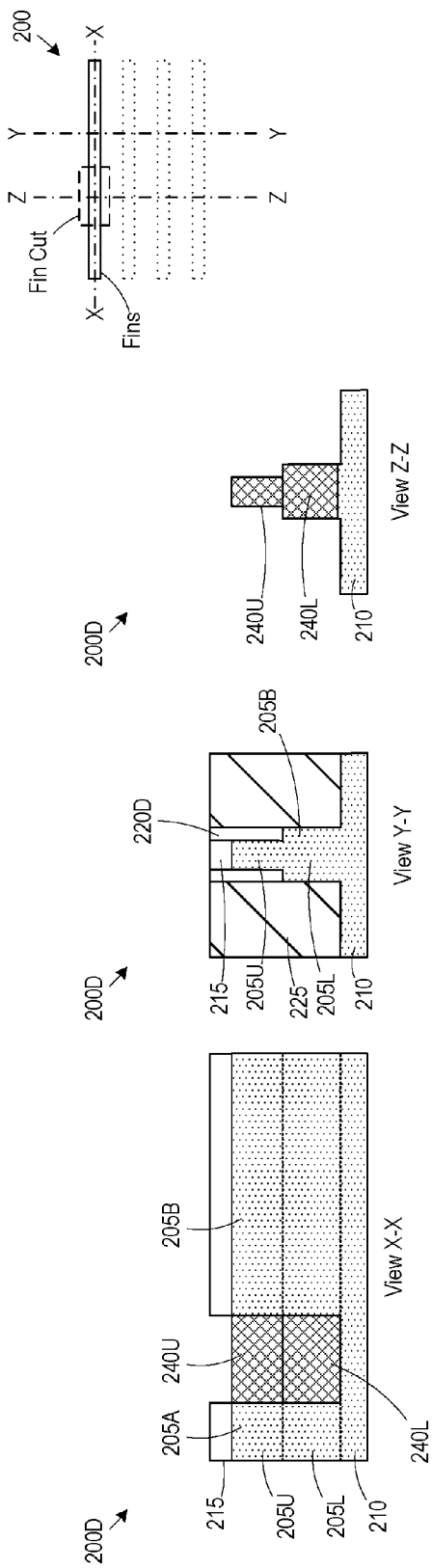

FIG. 6J illustrates the product 200D after a second oxidation process (e.g., thermal oxidation) was performed to oxidize the exposed portion of the upper fin portion 205U to define an upper diffusion break portion 240U. The diffusion break portions 240L, 240U divide the combined fin portions 205U, 205L into separate segments 205A, 205B. Subsequent processing may be completed using the process flows of FIGS. 2I-2L, FIGS. 3C-3F, or FIGS. 5A-5D, to complete product 200D.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a fin on a substrate;
   forming a first liner on said fin;
   forming a first dielectric layer above said first liner;
   patterning said first dielectric layer to define a fin cut opening therein, said fin cut opening exposing a portion of said first liner positioned above said fin;
   removing portions of said first liner exposed by said fin cut opening to expose a portion of said fin; and
   oxidizing said exposed portion of said fin to define a diffusion break in said fin, said diffusion break dividing said fin into first and second segments axially aligned with said diffusion break.

2. The method of claim 1, further comprising:
   forming a second liner on said diffusion break;
   forming a second dielectric layer above said second liner;
   recessing said first and second dielectric layers to expose an upper portion of said fin covered by said first liner and an upper portion of said diffusion break covered by said second liner; and
   removing portions of said first and second liners exposed by recessing said first and second dielectric layers to expose first and second portions of said fin disposed adjacent said diffusion break and at least a portion of said diffusion break.

3. The method of claim 2, wherein a cap layer is disposed above said fin, and the method further comprises removing said cap layer concurrently with removing said portions of said first and second liners exposed by recessing said first and second dielectric layers.

4. The method of claim 1, wherein a cap layer is disposed above said fin, and the method further comprises removing a portion of said cap layer exposed by said fin cut opening concurrently with removing said portions of said first liner exposed by said fin cut opening.

5. The method of claim 1, wherein said first dielectric layer comprises a hard mask.

6. The method of claim 1, further comprising:
   forming a second liner above said first dielectric layer and said diffusion break;
   recessing said first dielectric layer; and
   removing portions of said first and second liners exposed by recessing said first dielectric layer to expose first and second portions of said fin disposed adjacent said diffusion break and at least a portion of said diffusion break.

7. The method of claim 1, wherein forming said first liner comprises forming sidewall spacers.

8. The method of claim 1, further comprising:
   recessing said first dielectric layer prior to oxidizing said exposed portion of said fin; and
   forming a second liner on said diffusion break and on portions of said first liner exposed by recessing said first dielectric layer.

9. The method of claim 8, wherein forming said second liner comprises forming sidewall spacers.

10. The method of claim 8, further comprising:
    forming a second dielectric layer above said fin and said diffusion break;
    recessing said second dielectric layer to expose an upper portion of said fin covered by said first and second liners and an upper portion of said diffusion break covered by said second liner; and removing portions of said first and second liners exposed by recessing said second dielectric layer to expose first and second portions of said fin disposed adjacent said diffusion break and at least a portion of said diffusion break.

11. The method of claim 10, wherein a cap layer is disposed above said fin, and the method further comprises planarizing said second dielectric layer to expose said cap layer prior to recessing said second dielectric layer.

12. The method of claim 1, further comprising:
recessing said first dielectric layer;
forming a second dielectric layer above remaining portions of said first liner and said diffusion break;
recessing said second dielectric layer to expose an upper portion of said fin covered by said first liner and an upper portion of said diffusion break; and
removing portions of said first liner exposed by recessing said second dielectric layer to expose first and second portions of said fin disposed adjacent said diffusion break.

13. The method of claim 1, wherein forming said fin comprises forming trenches in said substrate to define an upper portion of said fin, forming said first liner comprises forming spacers on sidewalls of said upper portion, and the method further comprises etching said substrate in the presence of said spacers to deepen said trenches and define a lower portion of said fin below said upper portion.

14. The method of claim 13, further comprising:
oxidizing a portion of said lower portion of said fin exposed by removing portions of said first dielectric layer disposed below said fin cut opening while said spacers cover said upper portion of said fin to define a lower portion of said diffusion break;
removing portions of said spacers disposed below said fin cut opening; and
oxidizing a portion of said upper portion of said fin exposed by removing said portions of said spacers to define an upper portion of said diffusion break above said lower portion of said diffusion break.

15. The method of claim 14, further comprising:
forming a second liner above said first dielectric layer and said diffusion break;
recessing said first dielectric layer; and
removing portions of said first and second liners exposed by recessing said first dielectric layer to expose first and second portions of said fin disposed adjacent said diffusion break and at least a portion of said diffusion break.

16. The method of claim 15, further comprising:
recessing said first dielectric layer prior to oxidizing said exposed portion of said fin;
forming a second liner on said diffusion break and on portions of said first liner exposed by recessing said first dielectric layer;
forming a second dielectric layer above said fin and said diffusion break;
recessing said second dielectric layer to expose an upper portion of said fin covered by said first and second liners and an upper portion of said diffusion break covered by said second liner; and
removing portions of said first and second liners exposed by recessing said second dielectric layer to expose first and second portions of said fin disposed adjacent said diffusion break and at least a portion of said diffusion break.

17. The method of claim 1, wherein said fin comprises a strained material.

18. A method, comprising:
forming a fin on a substrate, wherein a cap layer is disposed on a top surface of said fin;
forming a first spacer on said fin;
forming a first dielectric layer above said fin;
patterning said first dielectric layer to define a fin cut opening therein, said fin cut opening exposing a portion of said cap layer and said first spacer positioned above said fin;
removing portions of said cap layer and said first spacer exposed by said fin cut opening to expose a portion of said fin;
oxidizing said exposed portion of said fin to define a diffusion break in said fin;
forming a liner on said diffusion break;
forming a second dielectric layer above said diffusion break;
exposing an upper portion of said fin covered by said cap layer and said first spacer and an upper portion of said diffusion break covered by said liner;
removing said cap layer and a portion of said first spacer disposed on said upper portion of said fin; and
removing a portion of said liner disposed on said upper portion of said diffusion break.

19. The method of claim 18, wherein said liner comprises a second spacer.

20. The method of claim 19, wherein forming said liner comprises forming said second spacer on said first spacer and on said diffusion break.

* * * * *